United States Patent [19]

Addis

[11] Patent Number: 4,667,146
[45] Date of Patent: May 19, 1987

[54] VOLTAGE-CONTROLLED PUSH-PULL CURRENT SOURCE

[75] Inventor: John L. Addis, Beaverton, Oreg.

[73] Assignee: Tektronix, Inc., Beaverton, Oreg.

[21] Appl. No.: 917,624

[22] Filed: Oct. 10, 1986

[51] Int. Cl.$^4$ ............................ G05F 3/20; H03F 3/45
[52] U.S. Cl. ..................................... 323/316; 330/149; 330/257
[58] Field of Search .................... 323/312, 315, 316; 307/296 R, 297; 330/257, 288, 297, 149, 254

[56] References Cited

U.S. PATENT DOCUMENTS 4,528,515  7/1985  Gross .................................. 330/254

Primary Examiner—Patrick R. Salce
Assistant Examiner—Kristine L. Peckham
Attorney, Agent, or Firm—Mark L. Becker; George T. Noe

[57] ABSTRACT

A voltage-controlled current source produces two output current signals whose difference is linearly related to an input voltage signal. The source includes an input buffer and a reference buffer each coupled separately to a current mirror and also coupled together across a current transmitting resistor. In response to the input voltage signal and current transmitted between the buffers, the current mirrors produce currents that differ in proportion to the difference between the input and reference voltage signals. The current mirrors also reproduce the differing currents in output paths as the output current signals. A fixed current source is coupled to each output path for drawing a fixed current from each path to linearize the current difference.

5 Claims, 1 Drawing Figure

VOLTAGE-CONTROLLED PUSH-PULL CURRENT SOURCE

TECHNICAL FIELD

This invention generally relates to signal current sources. More particularly, this invention relates to a voltage-controlled push-pull current source whose difference between the opposing current signals is linearly related to the input voltage signal.

BACKGROUND OF THE INVENTION

Push pull current sources find use in circuit design wherever the difference between opposing current signals is a preferred way to transmit a control signal. The sum of the opposing currents is constant, with the, difference between them proportional to the value of the control signal. Some of the applications for which such current sources are used include providing gain control for Gilbert gain cells and providing a precise offset current into a push-pull DC amplifier.

Conventional push-pull current sources suffer from several drawbacks. For one, their designs tend to be so complex that they are not easily adapted to different circuit environments. For another, the current signals lose their linear relationship to the control signal at its extreme values.

For example, U.S. Pat. No. 4,528,515 to Gross discloses a high-frequency differential amplifier whose linear relationship between its input voltage signal and output current signal is poor at the extreme values of the input signal.

SUMMARY OF THE INVENTION

An object of this invention, therefore, is to provide an improved push-pull signal current source of simple design.

Another object of the invention is to improve the linear relationship between the signal currents and the control signal.

Yet another object of the invention is to convert a voltage control signal to a pair of signal currents whose difference is proportional to the voltage of the control signal.

To achieve these objects, a voltage-controlled current source includes a pair of buffer means for isolating an input voltage signal and a reference voltage signal respectively with unity gain. A current means provides a current to each buffer means, the currents differing in proportion to the difference between the input and reference voltage signals. The current means also reproduce the differing currents in output paths as current signals. A fixed current source is coupled to each output path for drawing a fixed current from each path so that the difference between the remaining current signals is linearly related to the difference between the voltage signals.

In the embodiment described herein, the current means may comprise a current mirror and fixed current source for each buffer and a means for transmitting a current between the buffers proportional to the difference between the voltage signals. The transmitted current is summed with the fixed current drawn from each buffer means to determine the current required from each current mirror.

The foregoing and other objects, features, and advantages of the invention will become more apparent from the following detailed description of a preferred embodiment which proceeds with reference to the accompanying drawings.

DETAILED DESCRIPTION

Figure 1:
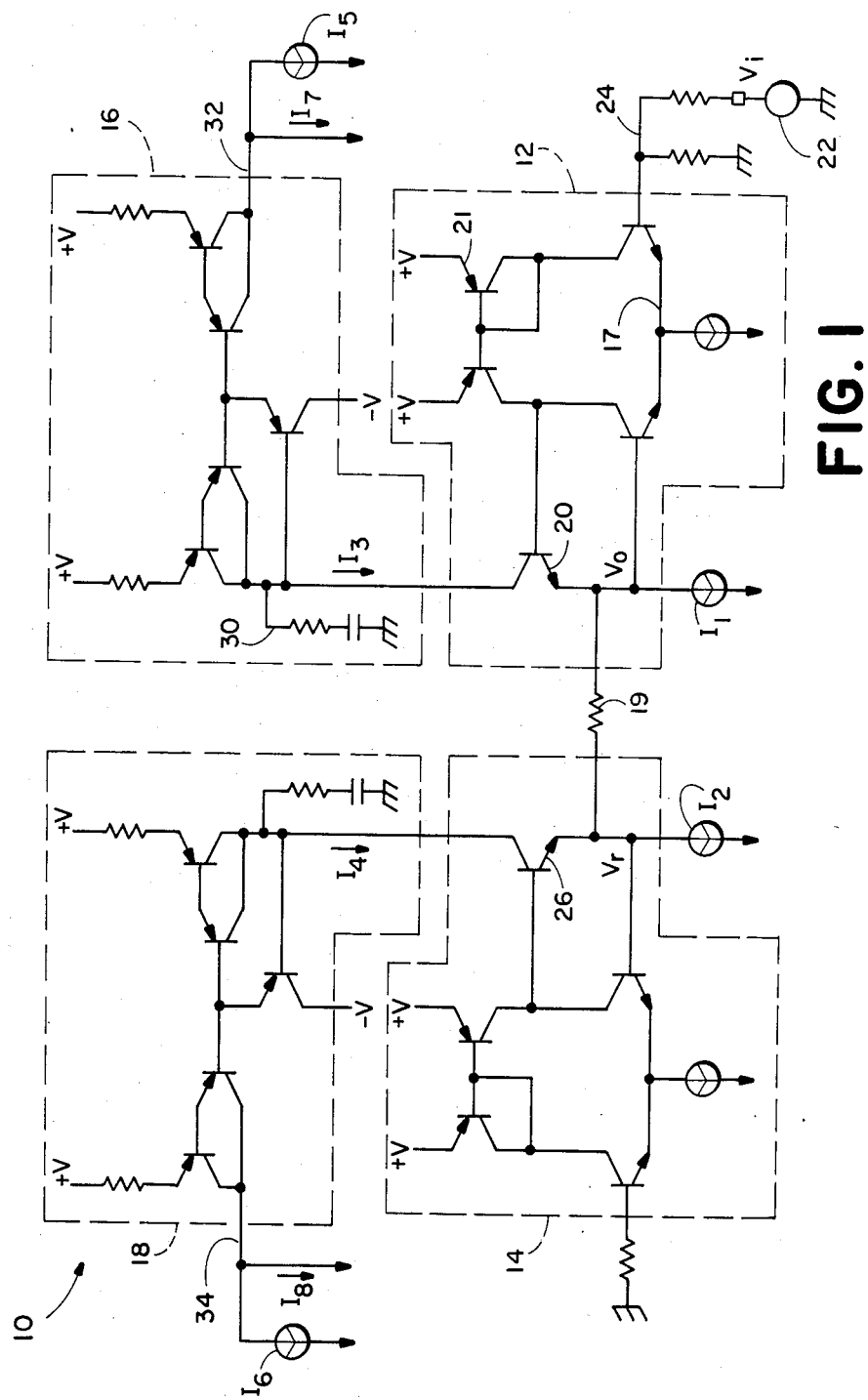
FIG. 1 a schematic diagram of a push-pull current source according to the invention.

A push-pull current source 10 according to the invention is shown in FIG. 1. The source includes an input buffer 12 for receiving an input voltage signal and a reference buffer 14 for producing a reference voltage signal. Buffers 12 and 14 are coupled separately to current mirrors 16 and 18, respectively. The buffers are also coupled together through a resistor 19 to transmit a current between them proportional to the voltage of the control signal. As will be explained hereinafter, the current mirrors provide currents that differ in proportion to the difference between the input and reference voltage signals. These currents are reproduced by the current mirrors 16 and 18 in output paths as current signals. It should be understood that the specific design shown for each buffer or current source is only to illustrate the invention and not to limit it.

Considering the elements of the current source 10 in more detail, the buffer 12 comprises a difference amplifier 17 with an active load 21 and an output transistor 20 connected with negative feedback to the difference amplifier. The input voltage signal $V_i$ is produced by a voltage source 22 and is applied to the difference amplifier 17 across a voltage divider 24 comprising a pair of resistors. The divider 24 provides the desired control signal range and reduces the susceptibility of the current source 10 to variations in the impedance of voltage source 22. The feedback through transistor 20 produces at its emitter an output voltage $V_o$ that is isolated from the control voltage signal and has power gain yet unity voltage gain with respect to $V_i$. Transistor 20 is biased by a fixed current source $I_1$ that draws a fixed current from the buffer 12.

The reference buffer 14 is of the same design as input buffer 12 but with a reference control voltage signal that is constant. In this embodiment the reference voltage is ground, assumed to be zero volts, and is applied to the input of buffer 14. The output voltage $V_r$ of the reference buffer is taken at the emitter of output transistor 26 and has power gain yet unity voltage gain with respect to ground. Transistor 26 is biased by a fixed current source $I_2$ that draws a fixed current from buffer 14 equal to the current drawn from buffer 12 by source $I_1$.

The buffers 12 and 14 are coupled together through means such as resistor 19 for transmitting a current between the buffers proportional to the difference between the input and reference voltage signals. The transmitted current is summed with the fixed current drawn from each buffer by sources $I_1$ and $I_2$ to determine the current required from the current mirrors for each buffer. The fixed current sources $I_1$ and $I_2$, the current mirrors 16 and 18, and the resistive coupling of buffers 12 and 14 therefore are a means for providing currents $I_3$ and $I_4$ that differ in proportion to the difference between the input and reference voltage signals.

Current mirrors 16 and 18 are of conventional design and may include any necessary compensation such as a series resistor-capacitor 30. Current mirror 16 reproduces current $I_3$ in an output path 32. Similarly, current mirror 18 reproduces current $I_4$ in an output path 34. Through the output path 32 and the output path 34, $I_3$ and $I_4$ are reproduced as output current signals that can be transmitted to other circuits such as a Gilbert gain signal.

In the process of raising and lowering $V_i$ to change $I_3$ and thereby $I_4$, the currents through the transistors 20 and 26 will vary. If $I_3$ or $I_4$ decrease sufficiently, they will no longer be linearly proportional to the difference between $V_o$ and $V_r$. The current source 10 avoids these nonlinear regions by adding in an extra or marginal current at sources $I_1$ and $I_2$ which is part of currents $I_3$ and $I_4$. This extra current is then subtracted before transmitting the output current signals to another circuit or device. Referring to the output paths 32 and 34, each path is coupled to a linearizing current source $I_5$ and $I_6$ respectively which subtracts off the extra current added into the current source 10 by $I_1$ and $I_2$. This subtraction leaves an output current signal $I_7$ in path 32 and an output current signal $I_8$ in path 34. These output current signals may vary to zero and still be linearly related to the difference between $V_o$ and $V_r$ because of the extra current.

The operation of the current source 10 is best understood by example. Assume initially that $V_o$ equals $V_r$ because $V_i$ is equal to zero volts. Both buffers 12 and 14 will draw equal currents $I_3$ and $I_4$ from their respective current mirrors in an amount essentially equal to $I_1$ and $I_2$. No current flows between the buffers because no voltage exists across resistor 19. Now assume that $V_i$ increases. $V_o$ will rise correspondingly as current is diverted from the active load 21 into the base of transistor 20 and as a result the collector current $I_3$ increases. The increase in $I_3$ flow out $I_1$, which is constant, but instead is diverted across resistor 19. Resistor 19 is chosen at a value such that the maximum transmitted current will be $I_1$ less the desired extra current.

The voltage $V_r$ remains fixed. The emitter current of transistor 26 is decreased as the transmitted current is summed with the fixed current drawn out of buffer 14 by source $I_2$. The collector current of transistor 26, $I_4$, correspondingly decreases an amount equal to the transmitted current. However, $I_4$ will not be completely shut off because of the limit placed on the transmitted current by the value of resistor 19. The minimum current $I_4$ is therefore the extra current added for linearity.

Currents $I_3$ and $I_4$ are reproduced in output paths 32 and 34 respectively. The marginal current is drawn off path 32 by current source $I_5$, leaving the signal current $I_7$. Similarly, the extra current is drawn off path 34 by current source $I_6$, leaving the opposing current signal $I_8$. With $I_4$ at its minimum, $I_8$ would be zero. Conversely, with $I_4$ at its maximum, $I_7$ would be zero. With fixed marginal currents $I_5$ and $I_6$ of equal value drawn from paths 32 and 34, $I_7$ and $I_8$ are still linearly related to the value of $V_i$.

Because of the balance in the current source 10 and the fixed current draws of current sources $I_1$, $I_2$, $I_5$ and $I_6$, the sum of the output signal currents $I_7$ and $I_8$ is always constant.

Having illustrated and described the principles of the invention in a preferred embodiment, it should be apparent to those skilled in the art that the invention can be modified in arrangement and detail without departing from such principles. For example, the buffers 12 and 14 could be provided by any number of well-known configurations, such as resistive loads instead of active loads, bootstrap circuits for feedback instead of a difference amplifier, substitution of field effect transistors for bipolar transistors, and so forth. I claim all modifications coming within the spirit and scope of the following claims.

I claim:

1. A voltage-controlled current source comprising:
   an input buffer means for isolating an input voltage signal;
   a reference buffer means for isolating a reference voltage signal;
   current means for providing a current to each buffer means, the currents differing in proportion to the difference between the input and reference voltage signals, the current means also reproducing the differing currents in output paths as current signals; and
   a fixed current source coupled to each output path for drawing a fixed current from each path so that the difference between the current signals remaining in the output paths is linearly related to the difference between the input and reference voltage signals.

2. The current source of claim 1 in which the current means comprises:
   a fixed current source for drawing a fixed current from each buffer means;
   a current mirror coupled to each buffer means for poviding the currents required by each buffer means, the current mirror also reproducing the required currents in the output paths; and
   means for transmitting a current between the two buffer means proportional to the difference between the input and reference voltage signals, the transmitted current summed with the fixed current drawn from each buffer means to determine the current required from the current mirrors for each buffer means.

3. The current source of claim 2 in which the current transmitting means comprises a resistor coupled between the buffer means.

4. The current source of claim 1 in which the input and reference buffer means each provide unity voltage gain to applied voltage signals.

5. The current source of claim 1 in which the input and reference buffer means each comprise a feedback amplifier having a difference amplifier for receiving the voltage signal and a feedback transistor for producing unity voltage gain.

* * * * *